(12) United States Patent
Wood et al.

(10) Patent No.: US 8,269,282 B2
(45) Date of Patent: Sep. 18, 2012

(54) SEMICONDUCTOR COMPONENT AND METHOD FOR PRODUCING A SEMICONDUCTOR COMPONENT

(75) Inventors: Andrew Wood, St. Jakob im Rosental (AT); Rudolf Zelsacher, Klagenfurt (AT); Markus Zundel, Egmatting (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/968,978

(22) Filed: Dec. 15, 2010

(65) Prior Publication Data

US 2011/0147843 A1   Jun. 23, 2011

(30) Foreign Application Priority Data

Dec. 22, 2009 (DE) .......................... 10 2009 060 072

(51) Int. Cl.
*H01L 29/76* (2006.01)
(52) U.S. Cl. ........ 257/367; 257/330; 257/331; 257/332; 257/333; 257/334; 257/E29.009
(58) Field of Classification Search .................. 257/367, 257/330–334, E29.009
See application file for complete search history.

(56) References Cited

U.S. PATENT DOCUMENTS

| | | | |
|---|---|---|---|
| 7,345,342 B2 * | 3/2008 | Challa et al. ................... | 257/341 |
| 7,372,103 B2 * | 5/2008 | Zundel et al. .................. | 257/330 |
| 2004/0031987 A1 * | 2/2004 | Henninger et al. ............ | 257/328 |
| 2007/0138544 A1 * | 6/2007 | Hirler et al. .................... | 257/330 |
| 2008/0042172 A1 * | 2/2008 | Hirler et al. .................... | 257/288 |
| 2009/0008706 A1 * | 1/2009 | Yedinak et al. ................ | 257/328 |
| 2009/0236660 A1 * | 9/2009 | Takahashi ...................... | 257/334 |
| 2010/0123188 A1 * | 5/2010 | Venkatraman ................. | 257/330 |
| 2010/0140689 A1 * | 6/2010 | Yedinak et al. ................ | 257/330 |

FOREIGN PATENT DOCUMENTS

| | | |
|---|---|---|
| WO | 0108226 A2 | 2/2001 |
| WO | 0171817 A2 | 9/2001 |

* cited by examiner

*Primary Examiner* — Eugene Lee
(74) *Attorney, Agent, or Firm* — Murphy, Bilak & Homiller, PLLC

(57) ABSTRACT

A semiconductor component includes at least one field effect transistor disposed along a trench in a semiconductor region and has at least one locally delimited dopant region in the semiconductor region. The at least one locally delimited dopant region extends from or over a pn junction between the source region and the body region of the transistor or between the drain region and the body region of the transistor into the body region as far as the gate electrode, such that a gap between the pn junction and the gate electrode in the body region is bridged by the locally delimited dopant region.

5 Claims, 5 Drawing Sheets

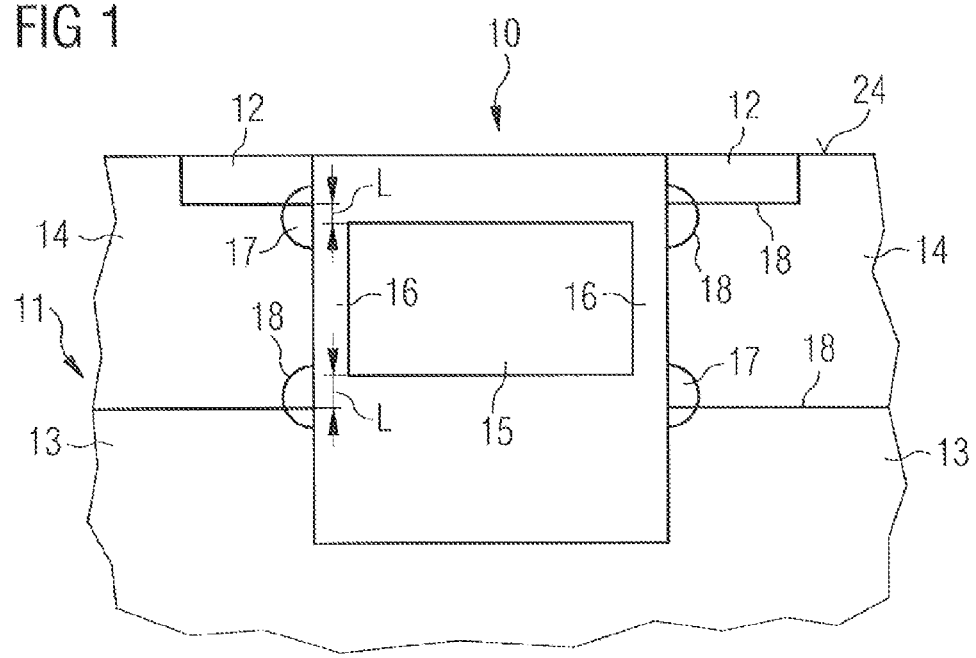

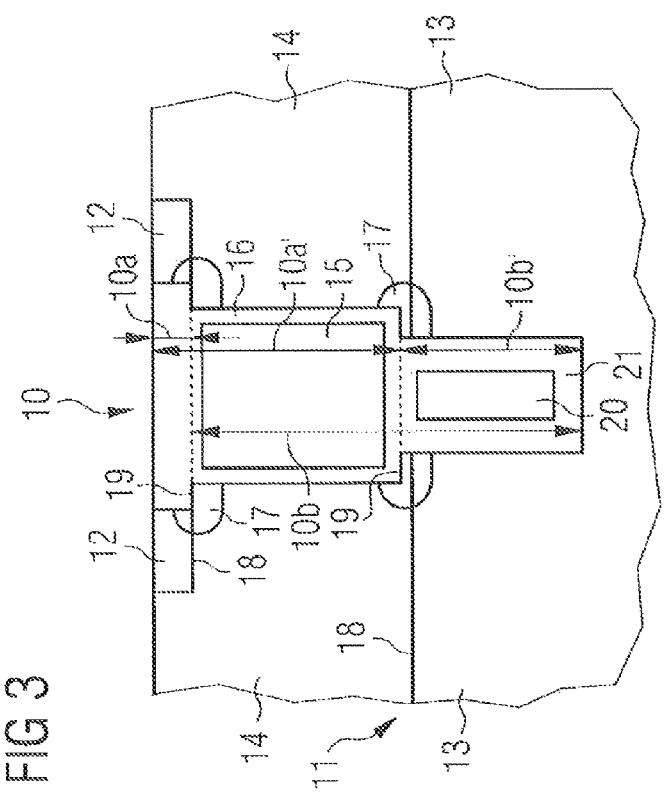
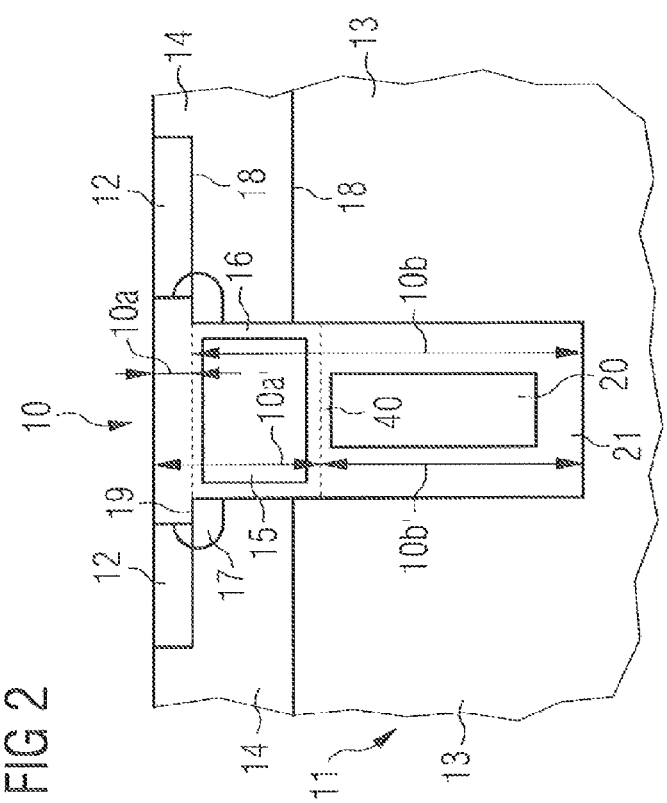

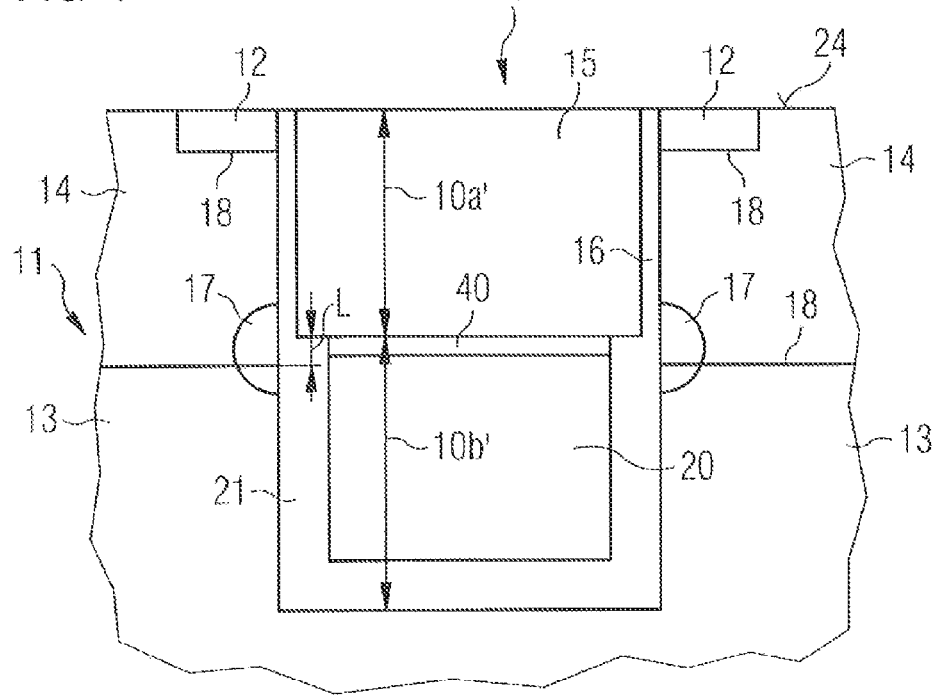

FIG 5
a) 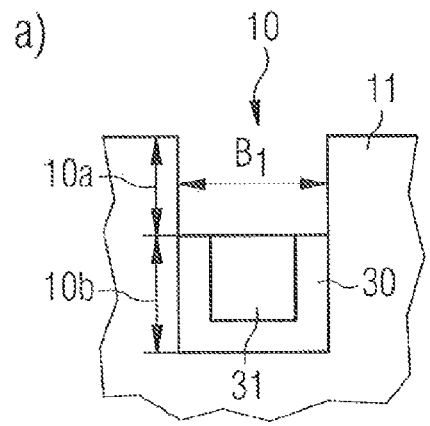
b) 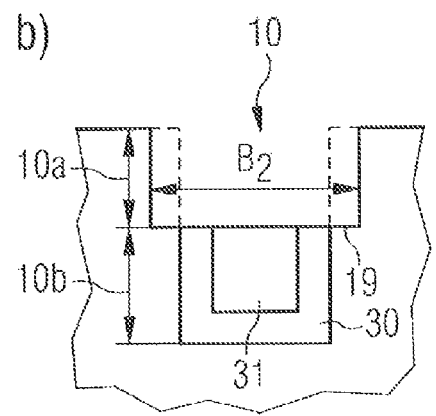
c) 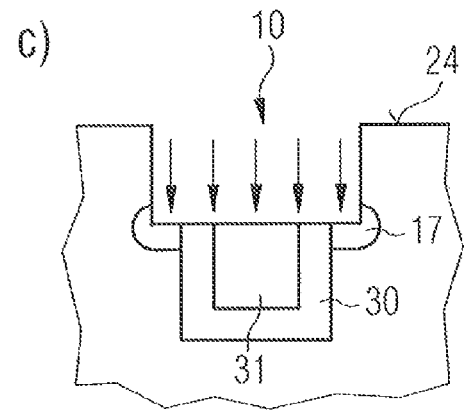
FIG 6
a) 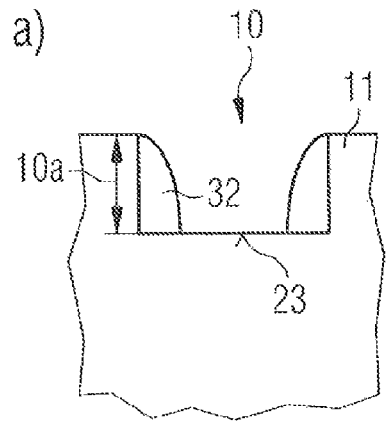
b) 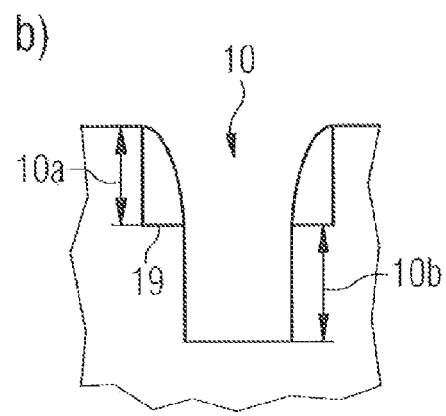
c) 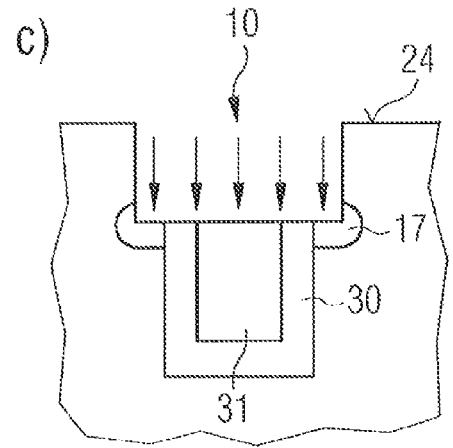

SEMICONDUCTOR COMPONENT AND METHOD FOR PRODUCING A SEMICONDUCTOR COMPONENT

PRIORITY CLAIM

This application claims priority from German patent application 10 2009 060 072.8 filed on 22 Dec. 2009, the content of said German application incorporated herein by reference in its entirety.

FIELD OF THE INVENTION

The invention generally relates to semiconductor components, and more particularly to semiconductor components with an integrated field effect transistor disposed along a trench in a semiconductor region, and to a method for producing the same.

BACKGROUND

In the development of new generations of semiconductor components, in particular of vertical power semiconductor components, reducing the specific on-resistance Ron is very important. By reducing the resistance it is possible firstly to minimize the static power loss and secondly to provide power semiconductor components having a higher current density. It is thereby possible to use significantly smaller and hence more cost-effective semiconductor components for the same total current.

One approach used to reduce the on-resistance is to use semiconductor components having trench structures instead of planar cell structures. In the case of such components, trenches are introduced into the semiconductor region, with vertically oriented gate electrodes being introduced into the trenches. Such semiconductor components have a larger channel width per unit area, as a result of which the on resistance Ron is significantly reduced. Particularly in the case of power semiconductor components, however, the influence of the resistance brought about from a drift zone on the total on resistance is particularly great. In order to reduce the on resistance, semiconductor structures having deep trenches are preferably used. The deep trenches adjoin the body zone or the channel zone in the upper region and project far into the drift zone in the lower region. The deep trenches have inside them a dielectric embodied in a step-like manner, the dielectric being made thicker in the lower region of the trench than in the upper region. In the upper region of the trench, the dielectric holds the gate oxide for channel control. In the lower region, the dielectric, typically embodied as a field oxide, serves for insulating a field plate from the semiconductor region.

WO 01/08226 A2 and WO 01/71817 A2 in each case describe trench MOSFETS having electrodes which are arranged in a trench extending into a semiconductor region. The electrodes are surrounded by a thicker insulation layer in the lower region than in the upper region of the trench, as a result of which the electrodes serve, in the upper region, upon a driving potential being applied, as a gate electrode for forming a conductive channel in an adjacent body zone and, in the lower region, as a field plate. The alignment of the gate electrodes with respect to the pn junctions of the body zone is of crucial importance for the reliable formation of a channel through the body zone. This is because if the pn junction does not lie in the region of influence of the gate electrode, it is not possible to form a channel extending over the entire body region as far as the respective pn junction. In particular, the optimization of a semiconductor component with regard to parasitic gate-source or gate-drain capacitances requires the gate electrodes to be aligned as precisely as possible with respect to the pn junctions in order, on the one hand, to have the smallest possible overlap between the gate electrode and the source or drain region, but on the other hand to provide for the reliable formation of a channel over the entire body region as far as the respective pn junctions. On account of fabrication tolerances during so-called recess etching of the structures in the trench of a trench MOSFET, this alignment is not possible in an optimal fashion.

SUMMARY

Embodiments described herein are directed to a semiconductor component including a pn junction self-aligned to the gate electrode and a method for producing the same.

According to an embodiment of a semiconductor component, the semiconductor component includes at least one field effect transistor disposed along a trench in a semiconductor region. The at least one field effect transistor has a source region of a first conductivity type, a drain region of a first conductivity type, a body region of a second conductivity type between the source region and the drain region in the semiconductor region, and a gate electrode in the trench along the body region. The gate electrode is arranged in a manner isolated from the body region by a gate dielectric. At least one locally delimited dopant region of the first conductivity type in the semiconductor region extends from or over a pn junction between the source region and the body region or between the drain region and the body region, and part of the dopant region lies in the body region opposite part of the gate electrode such that a gap in the body region between the pn junction and the gate electrode is bridged by the dopant region.

The locally formed dopant region, depending on the position of the dopant region, extends either the source region or the drain region as far as the gate electrode. The additional doping region thus bridges the gap between the gate electrode and the respective pn junction of the body region, as a result of which formation of a channel region over the entire body region is ensured responsive to the driving of the gate electrode. Moreover, because the additional dopant region is introduced via a uniform and self-aligned process step, the presence of this additional dopant region results in a constant overlap between the gate electrode and the source or drain region. Consequently, the resultant gate-source or gate-drain capacitance is also of the same magnitude over all semiconductor components produced in a semiconductor wafer.

According to an embodiment of a method for producing a semiconductor component including a dopant region in a semiconductor region, a trench is produced in the semiconductor region. The trench has an upper trench region and a lower trench region and the upper trench region is wider than the lower trench region, such that a step is formed in the semiconductor region. A dopant for the formation of a dopant region is introduced into the step of the semiconductor region in a locally delimited fashion.

The targeted, locally delimited introduction of the dopant into the step of the semiconductor region closes the gap between a pn junction and the gate electrode with the dopant region. Specifically through thermal diffusion of the dopant, the dimensions of the dopant region that arises can be precisely controlled in order firstly to form a channel in the body region under the influence of the gate electrode and secondly to minimize the parasitic gate-source or gate-drain capacitances.

The method is suitable, in particular, for producing a multiplicity of semiconductor components of identical type in a semiconductor wafer, where the position of the pn junctions relative to the gate electrode varies on account of fabrication tolerances, in particular during so-called "recess etching" of the structure within a trench over the semiconductor wafer. The method makes it possible to produce semiconductor components which can all form a gap-free channel in the body region of a trench MOSFET. For this purpose, the diffusion of the dopant is adapted to the largest ascertained gap of a trench MOSFET between pn junction and gate electrode. Semiconductor components having a smaller gap thereby incur only a small disadvantage by virtue of the parasitic gate/source or gate/drain capacitances increasing somewhat on account of a greater overlap, but this is acceptable within the context of the overall yield of functional semiconductor components with good Ron. The increase in the parasitic capacitances is limited, in particular, by the maximum—but small as seen in absolute terms—extent of the dopant regions.

In one embodiment of the semiconductor component, the trench has a wide upper trench region and a narrower lower trench region such that a step is formed in the semiconductor region. This enables easier local introduction of the dopant into the semiconductor region, for example by implantation into the step.

A further embodiment of the semiconductor component includes the gate dielectric and the gate electrode arranged in a first trench region and a field plate arranged in a second trench region along the drain region, with the field plate isolated from the drain region by a field dielectric. As a result, the semiconductor component can switch higher voltages.

The gate electrode can be isolated from the field plate by a dielectric. As a result, the gate electrode and the field plate can be connected to different potentials.

In one embodiment of the method, the trench is firstly produced with a width B1, the lower trench region is lined with a protective layer, and the upper trench region not lined by the protective layer is widened to a width B2. The widening can be effected for example by the removal of the semiconductor region in the unprotected upper region by the etching of the semiconductor region via the unprotected side walls or by an initial conversion of the non-covered side walls of the semiconductor region in the upper trench region into a sacrificial layer and a subsequent selective removal of this sacrificial layer from the semiconductor region.

Another variant of the method provides for the trench to be produced in such a way that firstly only the upper trench region is produced with a width B2, the side walls of the upper trench region are covered with a protective layer and the lower trench region at the non-protected bottom of the upper trench region is produced further into the semiconductor region with a width B1.

In one embodiment for the introduction of the dopant, the dopant is implanted into the semiconductor region. Preferably, the implantation is effected with an angle in the range of 0° to 7° with respect to a main surface normal of the semiconductor region, however other implantation angles can be used.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 shows a schematic of a semiconductor region of a semiconductor component with additional dopant regions for closing a gap in the body region of a field effect transistor between a pn junction and a gate electrode.

FIG. 2 shows a further of a semiconductor region of a semiconductor component with an additional dopant region at a step in the semiconductor region.

FIG. 3 shows a further schematic of a semiconductor region of a semiconductor component with additional dopant regions at a plurality of steps in the semiconductor region.

FIG. 4 shows a schematic of a semiconductor region of a semiconductor component with an additional dopant region at a field plate base point.

FIG. 5 shows, on the basis of schematic cross-sectional views a) to c) a method for producing a dopant region at a step in the semiconductor region.

FIG. 6 shows, on the basis of schematic cross-sectional views a) to c), another method for producing a dopant region at a step in the semiconductor region.

DETAILED DESCRIPTION

Figure 7:
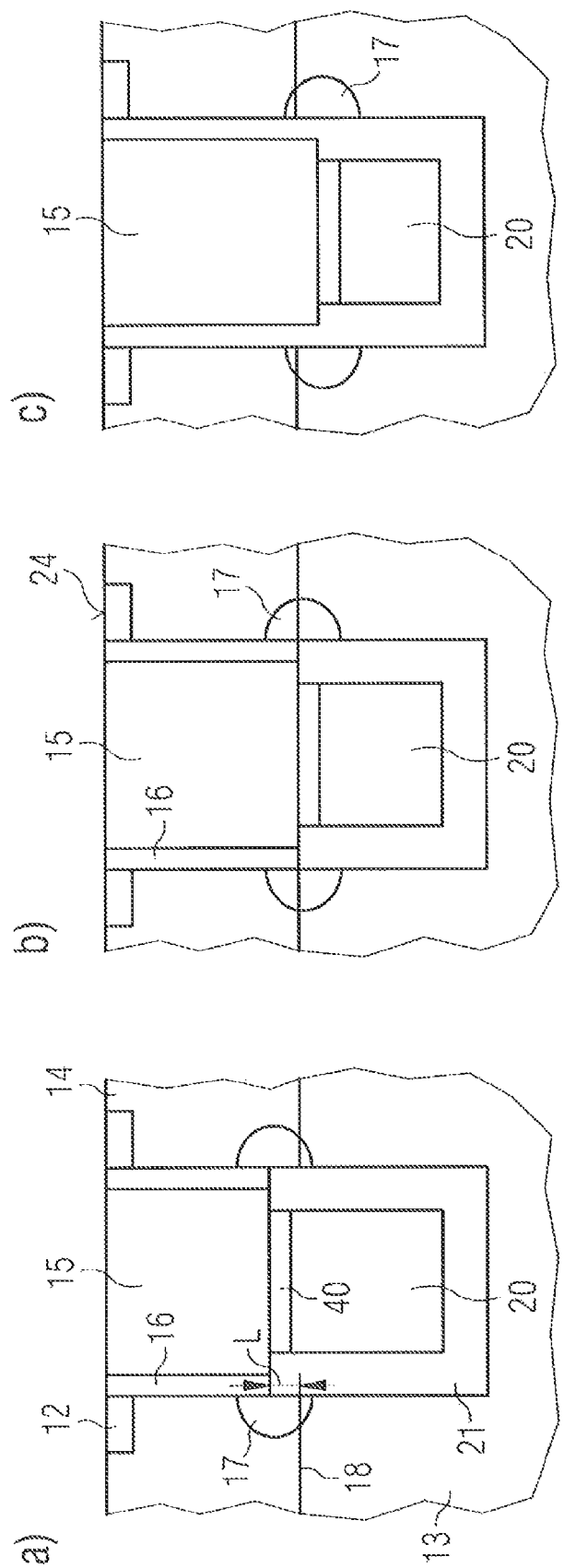
FIG. 7 shows, on the basis of schematic cross-sectional views a) to c) exemplary portions of a semiconductor wafer with a multiplicity of semiconductor components.

FIG. 1 illustrates a portion of a semiconductor region 11. In the semiconductor region 11 according to this embodiment, structures of field effect transistors are disposed along a trench 10. In this case, each field effect transistor has a source region 12, a drain region 13 and a body region 14 arranged between the source region 12 and the drain region 13. The source region 12 and the drain region 13 are doped with a dopant of a first conductivity type in this embodiment, for example arsenic for an n-type doping. However, phosphorus, sulphur, or antimony can be used as the n-type dopant. By contrast, the body region 14 is doped with a dopant of a second conductivity type such as, for example boron, aluminium, indium as p-type dopant. Depending on the dopant used for the individual regions, therefore, an n-channel or p-channel field effect transistor is formed. Depending on the use of the semiconductor component, the drain region 13 can also include a lightly doped partial region of the first conductivity type, in particular a drift region in the case of power semiconductor components. The drift region is then part of the drain region 13. The trench 10 is formed in the semiconductor region 11 and extends from a main surface 24 of the semiconductor region 11 along the source region 12 and along the body region 14 into the drain region 13.

A gate electrode 15 is arranged within the trench 10, the gate electrode 15 extending along the body region 14 and being isolated from the body region 14 by a thin gate dielectric 16. Polysilicon is advantageously used for the material of the gate electrode 15, but any other conductive material such as, for example, metal silicide, metal or the like can also be used.

Locally delimited dopant regions 17 are arranged in the semiconductor region 11. The dopant regions 17 have a dopant with the same first conductivity type as the source region 12 and the drain region 13. In this case, a dopant region 17 extends from or over a pn junction 18 between the source region 12 and the body region 14 or from or over a pn junction 18 between the drain region 13 and the body region 14 into the body region 14, such that a part of the dopant region 17 lies in the body region 14 opposite a part of the gate electrode 15. In this case, the dopant region 17 extends the source region 12 or the drain region 13 on account of its identical conductivity type with these regions, such that the remaining body region 14 between the pn junction 18, displaced as a result, in any case lies in the region of influence of the gate electrode. Full channel formation between the source region 12 and the drain region 13 is thus possible in the body region 14 through the influence of the gate electrode 15 corresponding to driving of the gate electrode 15.

FIG. 2 shows another embodiment of a semiconductor component. In this case, the trench 10 in the semiconductor region 11 includes a wide upper trench region 10a and a narrower lower trench region 10b, such that a step 19 is formed in the semiconductor region 11. In the example shown, the step 19 lies within the trench 10 at the pn junction 18 between the source region 12 and the body region 14. The gate electrode 15 lies within the trench 10 in the narrower lower trench region 10b in a first trench region 10a'. A field plate 20 is arranged below the gate electrode in a second trench region 10b' along the drain region 13. The field plate 20 is isolated from the drain region 13 by a field dielectric 21, which is thicker than the gate dielectric 16. In the trench 10 the field plate 20 is additionally isolated from the gate electrode 15 by a dielectric layer 40. In an alternative embodiment (not illustrated), however, the gate electrode 15 can also be linked with the field plate 20.

A dopant region 17 is formed at the step 19. The dopant region 17, as already described with regard to FIG. 1, extends the source region 12 in order to fill a gap L between the source region 12 and the gate electrode 15 in the body region 14. At the pn junction 18 between the body region 14 and the drain region 13, no dopant region is illustrated in FIG. 2 because there is no gap between the pn junction 18 and the gate electrode 15 in this region in the body region 14. A self-aligned introduction of the dopant region 17 at this location, on account of the self-alignment and the doping of identical type, would not lead to an extension of the drain region 13 and would therefore not be visible. Consequently, in such an example, an additional dopant region 17 would have no functional purpose, but would not be harmful either.

FIG. 3 shows a further exemplary embodiment of a semiconductor component with an additional dopant region 17 in a field effect transistor. In this embodiment, the trench 10 has a further step 19 at the transition region between the gate electrode 15 and the field plate 20 or between the thin gate dielectric 16 and the thicker field dielectric 21. A locally delimited dopant region 17 of a first conductivity type is likewise introduced in the semiconductor region into the step 19 of the semiconductor region 11, at the field plate base point, that is to say the transition from the gate electrode 15 to the field plate 20. The dopant region 17 extends over the pn junction 18 between the drain region 13 and the body region 14 and a part of the dopant region 17 lies in the body region 14 opposite the gate electrode 15, such that a gap L in the body region 14 between the pn junction 18 and the gate electrode 15 is bridged by the dopant region 17.

FIG. 4 shows a further embodiment of a semiconductor component with an additional dopant region 17 in a field effect transistor. In this case, the dopant region 17 is formed at the field plate base point of the trench MOSFET in order to bridge the gap L in the body region 14. In addition, in this exemplary embodiment, the gate electrode 15 in the trench 10 is formed as far as the main surface 24, such that there is no gap L at the pn junction 18 between the source region 12 and the body region 14 and, consequently, no dopant region 17 is required in this portion of the body region 14.

FIG. 5 shows, on the basis of schematic cross-sectional views a) to c), an embodiment of a method for producing dopant regions 17 in a semiconductor region 11 of a semiconductor component.

FIG. 5a shows an intermediate result of the method, wherein a trench 10 having a first width B1 has been introduced into the semiconductor region 11. The semiconductor region 11 is an n-doped semiconductor wafer, for example, into which the trench 10 is etched from the main surface 24. Afterward, by way of example, the entire uncovered main surface 24 and the surface in the trench 10 are coated with a protective layer 30, preferably a field dielectric, in particular an oxide layer. Afterwards, an auxiliary layer 31 provided in the trench 10 is produced. This can be done for example by large-area deposition of a photoresist, which is subsequently etched back to an extent such that a resist plug 31 remains only in a lower trench region 10b. Alternatively, however, the auxiliary layer 31 can also be produced from polycrystalline silicon or some other electrically conductive material, which likewise is firstly deposited over a large area and is etched back by so-called recess etching to an extent such that a field plate serving as an auxiliary layer 31 remains in the lower trench region. Afterward, the protective layer 30 is removed by etching, for example, to an extent such that the protective layer 30 is likewise only present in the lower trench region 10b and lies between the semiconductor 11 and the auxiliary layer 31. In an upper trench region 10a, the surfaces of the semiconductor region 11 are thus free again.

As illustrated in FIG. 5b, the trench 10 is widened in the upper trench region 10a to a width B2. This is done either by direct etching of the semiconductor region 11 at the uncovered surfaces in the trench 10 or by conversion of the uncovered surfaces of the semiconductor region 11 in the upper trench region 10a, such as, for example, to a thermally produced oxide layer, and subsequent selective removal, by these sacrificial layers being etched, for example. As a result, as shown in FIG. 5b, a step 19 arises in the semiconductor region 11 at the transition from the upper trench region 10a to the narrower trench region 10b. The step 19 need not necessarily be an exactly formed, i.e. substantially horizontal, step. A step should be understood to be more or less any structure formed in a stepped fashion which constitutes the transition between upper trench region 10a and lower trench region 10b. For technological reasons, such a step may be rounded at least at the corners and edge and be more or less oblique.

FIG. 5c shows the introduction of the dopant for the formation of the dopant region 17 in the step 19 of the semiconductor region 11. In the present example of an n-doped semiconductor wafer as semiconductor region 11, an n-type dopant is implanted into the step 19 of the semiconductor region 11. The implantation takes place through the trench opening at the main surface 24, and is preferably effected at an implantation angle of 0° to 7° with respect to the main surface normal of the semiconductor wafer. The implantation dose is chosen such that the dopant concentration is slightly increased with respect to the dopant concentration of the semiconductor region.

A subsequent thermal treatment of the semiconductor region 11, in particular the formation of a gate dielectric by thermal oxidation, causes additional outdiffusion of the dopant in the semiconductor region 11. This outdiffusion is implemented until the dopant region 17 that forms in the process extends over a pn junction of the finished field effect transistor. For short diffusion distances, it is advantageous if the implantation of the dopant is effected for example only after the formation of the gate dielectric, because the thermal budget for the diffusion thereby turns out to be significantly lower and the diffusion of the implanted dopant is thereby very much smaller.

FIG. 6 shows an alternative embodiment for forming a step in the semiconductor region 11. As illustrated in FIG. 6a, firstly a trench 10 having a smaller depth and having a width B2 is produced in the semiconductor region 11. This first depth corresponds to the depth of the later upper trench region 10a. The side walls of the upper trench region 10a are covered with a spacer layer 32, for example with a nitride spacer, and the lower trench region 10b is subsequently produced at the non-protected bottom 23 of the upper trench region 10a further into the semiconductor region 11 until the complete trench 10 is formed. This is illustrated in FIG. 6b. As shown in FIG. 6c, afterward, in the lower trench region 10b, a protective layer 30 is formed, preferably a field dielectric layer at the semiconductor surface, the spacer layer 32 is removed in the upper trench region 10a and a field plate 31 is thereupon produced in the lower trench region 10b. The implantation of the dopant for the dopant regions 17 to be formed in the resultant step 19 in the semiconductor region 11 at the transition from the upper trench region 10a to the narrower lower trench region 10b is effected in accordance with the explanations with regard to FIG. 5c.

FIG. 7 illustrates, in partial excerpts a), b) and c), a semiconductor wafer with identical field effect transistors which, on account of manufacturing tolerances, have different relative positions of a pn junction 18 with respect to the gate electrode 15.

FIG. 7a illustrates a field effect transistor corresponding to the field effect transistor with regard to FIG. 4a. In this case, the additional dopant region 17 is formed around the field plate base points of a trench MOSFET in order to bridge a gap L in the body region 14. This field effect transistor is formed, for example, in the edge of a semiconductor wafer.

A field effect transistor identical to the field effect transistor from FIG. 7a is formed in FIG. 7b, but its field plate base point or its gate electrode 15 is oriented virtually ideally with respect to the pn junction 18. However, this configuration results only at this location because, on account of manufacturing tolerances during the process for the recess etching of electrodes in trenches, this optimum setting cannot be produced over the entire semiconductor wafer with a recess etching process. Consequently, the additional dopant region 17 does not afford an advantage for the channel formation in the body region 14. This field effect transistor is formed, for example, between the edge region and the centre in the semiconductor wafer.

FIG. 7c shows a further field effect transistor of identical type, this transistor being formed, for example, in the centre of a semiconductor wafer. In this case, the gate electrode 15 still overlaps the drain region 13 which has a negative influence on the parasitic drain capacitance $Q_{GD}$ of the field effect transistor. In order to minimize the latter, it is endeavoured to minimize this overlap. These endeavours involve attempting to position the gate electrode 15 as optimally as possible, as illustrated in FIG. 7b, relative to the pn junction 18. However, this increases the proportion of field effect transistors on the semiconductor wafer which have a gap L in the body region 14 during channel formation. The additional dopant region 17 makes it possible to bridge this gap.

For all types of production shown, it is unimportant when the source regions 12 and the body regions 14 in the semiconductor region and, consequently, also the pn junctions 18 are produced. Generally, however, this takes place before the formation of the dopant regions 17.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
    at least one field effect transistor disposed along a trench extending vertically downward from a horizontal top surface in a semiconductor region, the at least one field effect transistor having a source region of a first conductivity type along the trench and extending downward from the horizontal top surface, a drain region of the first conductivity type, and a body region of a second conductivity type disposed between the source region and the drain region in the semiconductor region so as to form a first generally horizontal junction between the source region and the body region and a second generally horizontal junction between the body region and the drain region, the first and second generally horizontal junctions having a first vertical depth and a second vertical depth, respectively, relative to the horizontal top surface;
    a gate electrode in the trench along the body region, said gate electrode being arranged in a manner isolated from the body region by a gate dielectric and extending vertically from an uppermost surface of the gate electrode, at a third vertical depth relative to the horizontal top surface, to a lower-most surface of the gate electrode, at a fourth vertical depth relative to the horizontal top surface, such that either the third vertical depth is greater than the first vertical depth or the fourth vertical depth is less than the second vertical, or both; and
    a first locally delimited dopant region of the first conductivity type in the semiconductor region, the first locally delimited dopant region extending either downward from the first generally horizontal junction between the source region and the body region to below the third vertical depth, or extending upward from the second generally horizontal junction between the drain region and the body region to above the fourth depth, so that a part of the first dopant region extends vertically in the body region to bridge a gap in the body region between the first vertical depth and the third vertical depth or a gap in the body region between the second vertical depth and the fourth vertical depth.

2. The semiconductor component according to claim 1, wherein the trench comprises a wide upper trench region and a narrower lower trench region such that a step is formed in the semiconductor region.

3. The semiconductor component according to claim 1, wherein the gate dielectric and the gate electrode are arranged in a first region of the trench and a field plate is arranged in a second region of the trench along the drain region, and the field plate is isolated from the drain region by a field plate dielectric.

4. The semiconductor component according to claim 3, wherein the gate electrode is isolated from the field plate by a dielectric.

5. The semiconductor component of claim 1, wherein the first locally delimited dopant region extends downward from the first generally horizontal junction between the source region and the body region to below the third vertical depth, so as to bridge a first gap in the body region between the first vertical depth and the third vertical depth, the semiconductor component further comprising a second locally delimited dopant region extending upward from the second generally horizontal junction between the drain region and the body region to above the fourth depth, so that a part of the first dopant region extends vertically in the body region to bridge a second gap in the body region between the second vertical depth and the fourth vertical depth.

* * * * *